(12) United States Patent
Spence, Jr.

(10) Patent No.: US 8,107,240 B2
(45) Date of Patent: Jan. 31, 2012

(54) ELECTRONIC GAMING MACHINE INTERFACE SYSTEM

(75) Inventor: David Alan Spence, Jr., Menifee, CA (US)

(73) Assignee: San Pasqual Casino Development Group Inc., Valley Center, CA (US)

( * ) Notice: Subject to any disclaimer, the term of this patent is extended or adjusted under 35 U.S.C. 154(b) by 174 days.

(21) Appl. No.: 12/703,028

(22) Filed: Feb. 9, 2010

(65) Prior Publication Data

US 2011/0194251 A1 Aug. 11, 2011

(51) Int. Cl.
*H05K 7/20* (2006.01)
*H01L 23/34* (2006.01)
*H02G 3/03* (2006.01)
*A63F 9/24* (2006.01)

(52) U.S. Cl. .......... 361/695; 361/679.48; 361/752; 361/791; 257/721; 174/16.1; 463/46

(58) Field of Classification Search .......... 361/752, 361/485, 789, 791, 736, 695, 679.48–679.51; 257/721; 174/16.1; 463/46, 47
See application file for complete search history.

(56) References Cited

U.S. PATENT DOCUMENTS

| | | | |
|---|---|---|---|
| 5,748,426 A * | 5/1998 | Bedingfield et al. | 361/58 |
| 2005/0165572 A1* | 7/2005 | Holt et al. | 702/117 |
| 2008/0214302 A1* | 9/2008 | Nagano | 463/31 |
| 2009/0247265 A1* | 10/2009 | Abe | 463/20 |

* cited by examiner

*Primary Examiner* — Zachary M Pape
(74) *Attorney, Agent, or Firm* — Marger, Johnson & McCollom PC

(57) ABSTRACT

An electronic gaming machine interface system including a first circuit board, a bracket coupled to the first circuit board, a fan coupled to the bracket and disposed over the first circuit board, a second circuit board coupled to the bracket, a first cable coupled between a connector of the first circuit board and a connector of the second circuit board; and a second cable coupled between a connector of the first circuit board and a connector of the second circuit board.

13 Claims, 5 Drawing Sheets

ELECTRONIC GAMING MACHINE INTERFACE SYSTEM

BACKGROUND

This disclosure relates to electronic gaming machines and, in particular, to an interface system for an electronic gaming machine.

An electronic gaming machine can include an interface between the electronic gaming machine and a player tracking system. Such an interface can include a circuit board with processors, connectors, and other electronics. The circuit board can be located within a housing of the electronic gaming machine.

However, inside the housing of the electronic gaming machine, the circuit board can be subject to harsh environmental conditions. For example, a lack of air circulation, multiple lights, various circuitry, or the like can increase the temperature within the housing. As a result, a possibility that the circuit board will overheat can be increased. In addition, the circuit board may be located in the housing in a difficult to reach location. Accordingly, accessing the circuit board can be difficult.

DETAILED DESCRIPTION

Embodiments will be described in reference to the drawings. In particular, embodiments will be described where access to and/or an environment of an electronic gaming machine interface can be improved.

Figure 1:
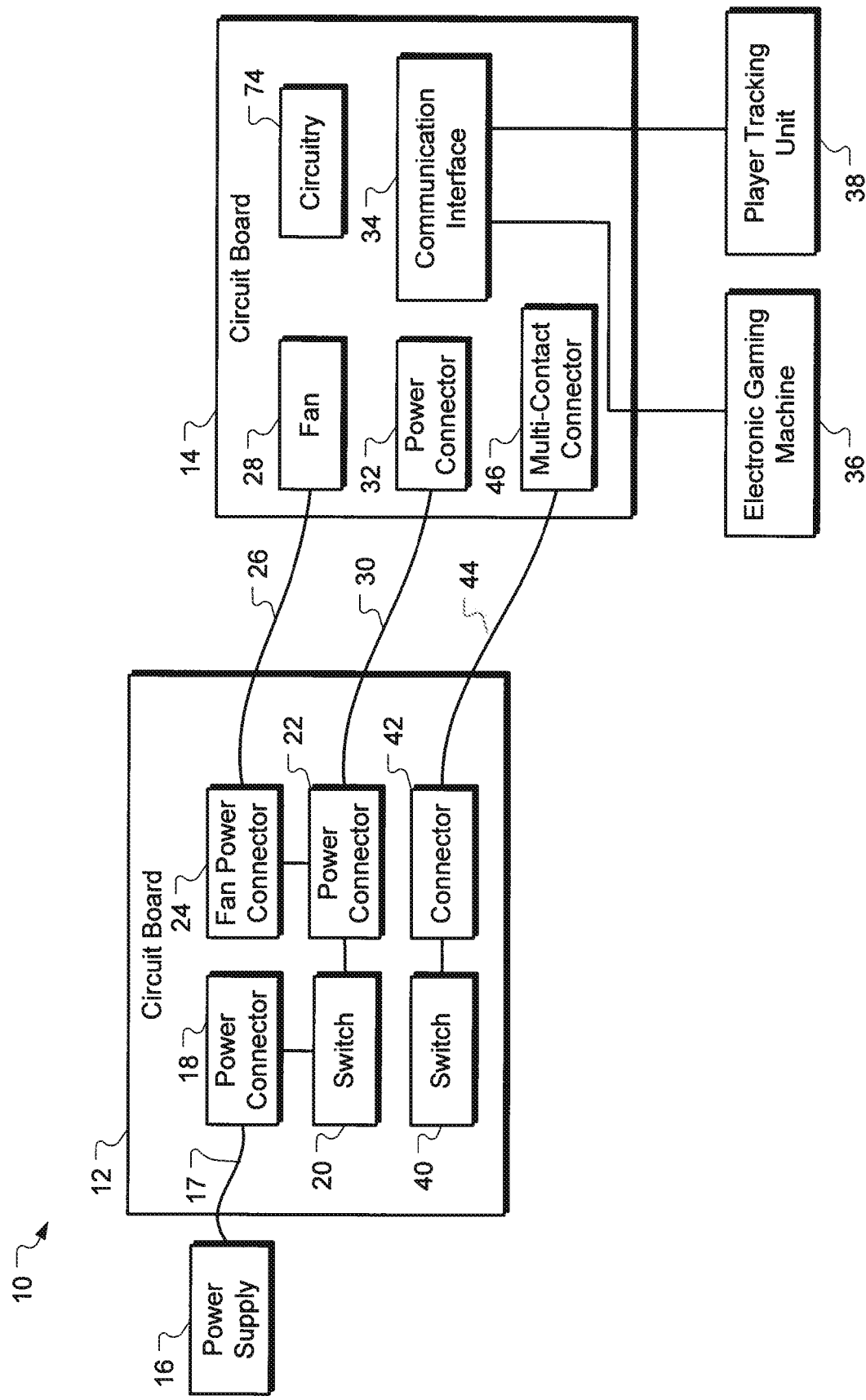
FIG. 1 is a block diagram of an electronic gaming machine interface system according to an embodiment.

FIG. 1 is a block diagram of an electronic gaming machine interface system according to an embodiment. In this embodiment, the system 10 includes a first circuit board 14 and a second circuit board 12. The first circuit board 14 is coupled to the second circuit board 12 through cables 26, 30, and 44.

The first circuit board 14 includes a communication interface 34 configured to couple the first circuit board 14 to an electronic gaming machine 36 and a player tracking unit 38. The communication interface 34 can be any variety of interfaces. For example, the communication interface 34 can include a direct connection through connectors and cables to the electronic gaming machine 36 and the player tracking unit 38. In another example, the communication interface 34 can be coupled to the electronic gaming machine 36 and the player tracking unit 38 through a network such as an Ethernet network, a controller-area network, or the like. Moreover, the communication interface 34 can include multiple individual communication interfaces for connecting to the electronic gaming machine 36 and the player tracking unit 38. For example, a first communication interface can be used to couple to the electronic gaming machine 36 while a second, different communication interface can be used to couple to the player tracking unit 38.

The first circuit board 14 also includes a power connector 32 and a multi-contact connector 46. The power connector 32 is coupled to a corresponding power connector 22 on the second circuit board 12 through a cable 30. The power connector 32 can be configured to receive power for the first circuit board 14. In an embodiment, the power connector 32 can have two contacts for a power supply and a return. However, in other embodiments, the power connector 32 can have any number of power supplies, common nodes, separate returns, or the like.

The multi-contact connector 46 can have a variety of different configurations. For example, the multi-contact connector can be a single row of contacts, a double row of contacts, or the like. In an embodiment, the multi-contact connector 46 includes at least three contacts, pins, or the like. In particular, two of the pins are configured to be used in resetting the first circuit board 14. For example, two of the pins can be shorted together while the power supply 16 is cycled. The first circuit board 14 can be reset in response to such an operation.

In an embodiment, since there are multiple contacts on the multi-contact connector 46, an error can be made where other contacts are shorted in addition to or instead of the desired contacts to reset the first circuit board 14. In such a circumstance, the first circuit board 14 may not be reset, may be damaged, or the like. However, a cable 44 couples the multi-contact connector 46 to the second circuit board 12. Thus cable 44 is coupled to the contacts of the multi-contact connector 46 associated with the reset function.

The second circuit board 12 includes connectors 22 and 42 corresponding to the power connector 32 and multi-contact connector 46 of the first circuit board 14. The power connector 22 is coupled to the power supply 16. In this embodiment, the power connector 22 is coupled through a switch 20, connector 18 and cable 17 to the power supply 16. Thus, power from the power supply 16 can be controlled using the switch 20. In particular, since the power supply 16 is coupled to the first circuit board 14 through the cable 30, the power supply for the first circuit board 14 can be switched with the switch 20. Moreover, with a first circuit board 14 without a switch that can switch the power supply 16 on and off, the power to the first circuit board 14 can still be controlled. Thus, the connections to the first circuit board 14 can be maintained while the power is controlled. That is, a connector that supplies power to the first circuit board 14 need not be removed, disconnected, or the like in order to cycle the power supplied to the first circuit board 14.

In addition, in an embodiment, the second circuit board 12 can include a switch 40. The switch 40 can be configured to couple multiple contacts of the connector 42 together. The cable 44 can couple those contacts of the connector 42 to contacts of the connector 46 which are used in connection with resetting the first circuit board 14. Thus, the first circuit board 14 can be reset with the use of the switch 40. As a result, a chance of shorting incorrect contacts of the multi-contact connector 46 can be reduced if not eliminated. Moreover, as described above, the first circuit board 14 may be reset in response to the shorting of contacts while the power is cycled. The second circuit board 12 and the switches 20 and 40 allow a user to manipulate the switches 20 and 40 to achieve the reset function without the need of accessing individual contacts of the multi-contact connector 46 of the first circuit board 14 or disconnecting the cable 30 to remove power.

Although the electronic gaming machine 36 is illustrated as separate from the circuit board 12 and 14, the electronic gaming machine 36 can include a housing substantially encapsulating the first circuit board 14, the second circuit board 12, the power supply 16, the player tracking unit 38, a combination of such components, or the like.

In an embodiment, the system 10 can include a fan 28. As illustrated, the fan 28 can be disposed on the first circuit board 14. However, as will be described in further detail below, the fan 28 can be disposed such that the fan 28 can direct air to or from the first circuit board 14. In particular, the first circuit board 14 can include circuitry 74 that can generate an amount of heat that, in the environmental conditions of the electronic gaming machine 36, can cause the circuitry 74 to fail.

In this embodiment, the fan 28 is coupled to the fan power connector 24 on the second circuit board 12. In addition, the fan power connector 24 can be coupled to the power connector 22, the switch 20, or the like. Thus, the power to the fan 28 can be controlled along with the power to the first circuit board 14. However, in another embodiment, the power to the fan 28 need not be switched, the power can be controlled through a separate switch, or the like.

Figure 2:
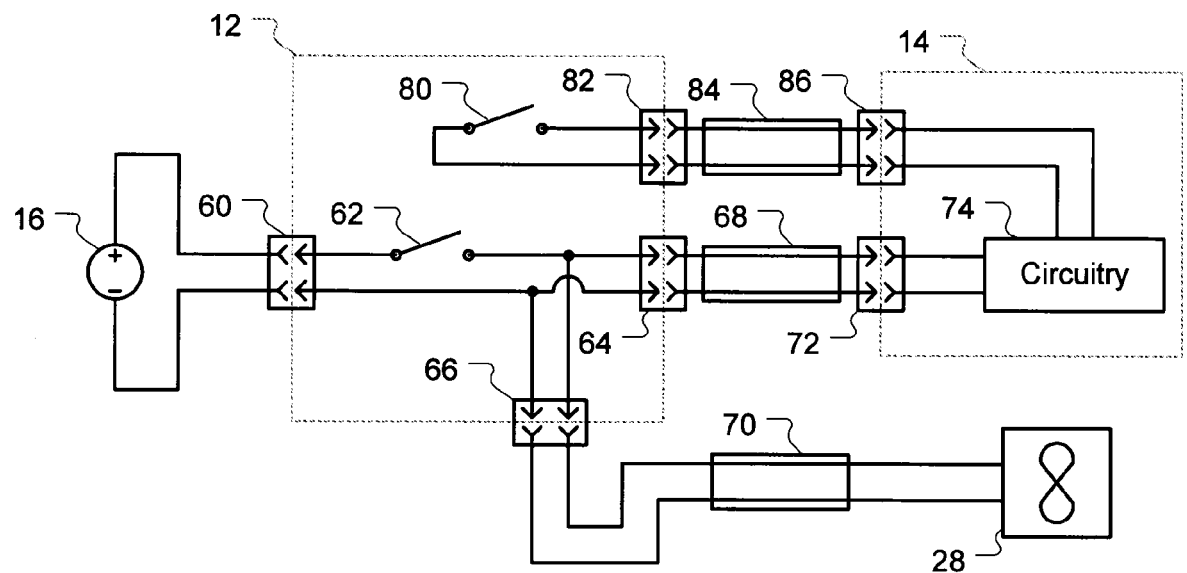
FIG. 2 is a schematic of an electronic gaming machine interface system according to an embodiment.

FIG. 2 is a schematic of an electronic gaming machine interface system according to an embodiment. In this embodiment, the power supply 16 is illustrated as merely coupled to the second circuit board 12 through the connector 60. However, the power supply 16 can be coupled to the second circuit board through a cable, directly connected, or the like.

A single conductor of the power supply 16 on the second circuit board 12 is switched with switch 62. Accordingly, the switched power can be provided through the connector 64, the cable 68, and the connector 74 to provide power to the circuitry 74 of the second circuit board 14. In addition, the switched power supply can also be coupled to the fan 28 through the connector 66, and the cable 70. Although the fan 28 is illustrated as being directly connected to the cable 70, the fan 28 could have a connector, or be coupled to the cable 70 in other ways.

The switch 80 is coupled between two contacts of the connector 82. Thus, when the switch 80 is closed, the contacts of the connector 82 can be shorted together. As a result, the wires of the cable 84, the contacts of the connector 86 of the first circuit board 14, and corresponding nodes of the circuitry 74 can be shorted together. Although the connector 86 is illustrated as including only two contacts, as described above the connector 86 can include three or more contacts.

As a result, various control of the circuitry 74 that was otherwise in a relatively inaccessible location, in a configuration that invited errors that could be catastrophic, or the like, can be controlled with a reduced chance of such problems, increased ease of access, and the like.

Figure 3:
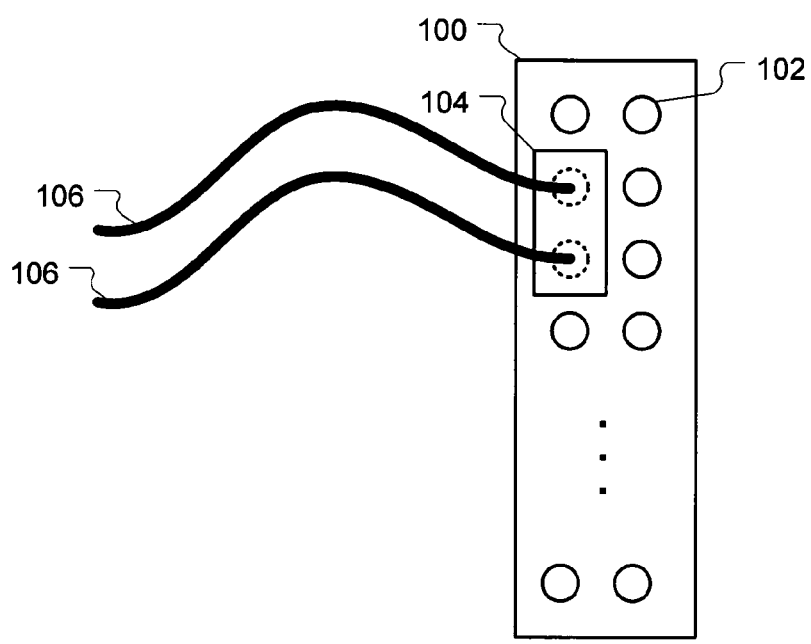
FIG. 3 is an enlarged view of a connection to a connector of an electronic gaming machine interface circuit board according to an embodiment.

FIG. 3 is an enlarged view of a connection to a connector of an electronic gaming machine interface circuit board according to an embodiment. In this embodiment, the connector 100 includes two rows of contacts 102. However, in other embodiments, the connector 100 could have additional rows that can make the shorting of two contacts even more prone to error. Furthermore, the connector can have any number of contacts. For example, the connector 100 can be a 40 contact connector with the contacts disposed in two rows.

The wires 106 are an example of wires of a cable 84 described above with respect to FIG. 2. The wires 106 are coupled to the connector 104. The connector 104 is coupled to the connector 100 such that two contacts 102 of the connector 100 make electrical with the connect 104 and hence the wires 106. The wires 106 can be coupled to the second circuit board 12. As a result, the risk of inadvertent contact with other contacts 102 of the connector 100 can be reduced.

Figure 4:
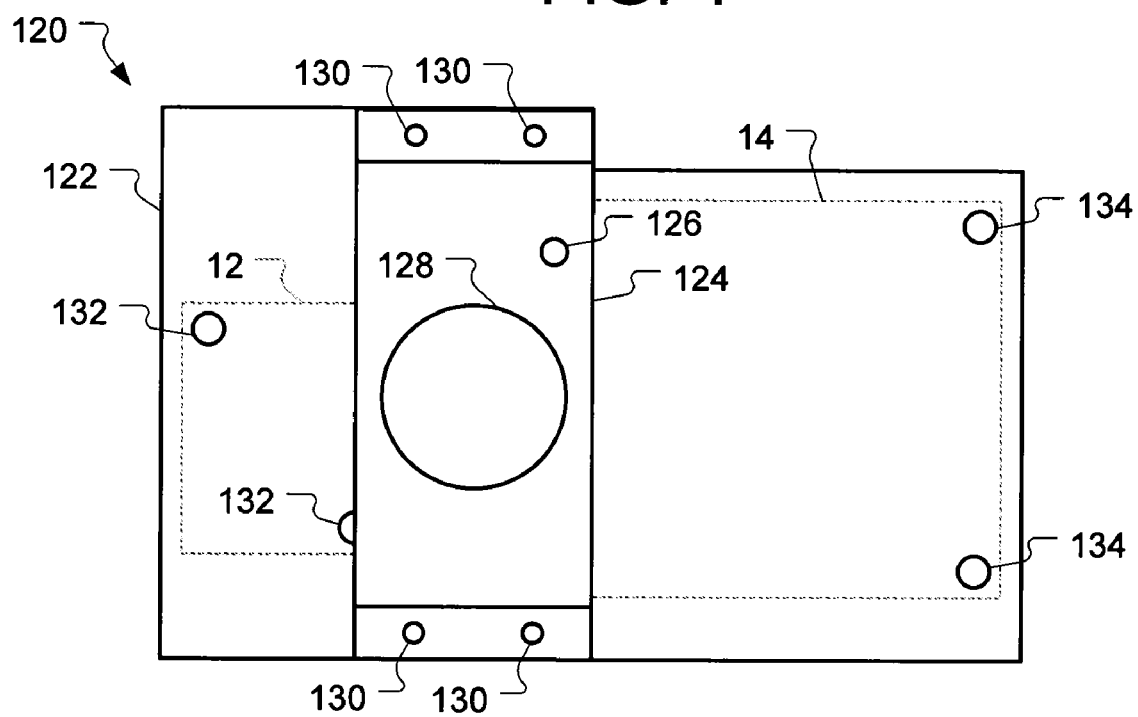
FIG. 4 illustrates a bracket for an electronic gaming machine interface system according to an embodiment.
Figure 5:
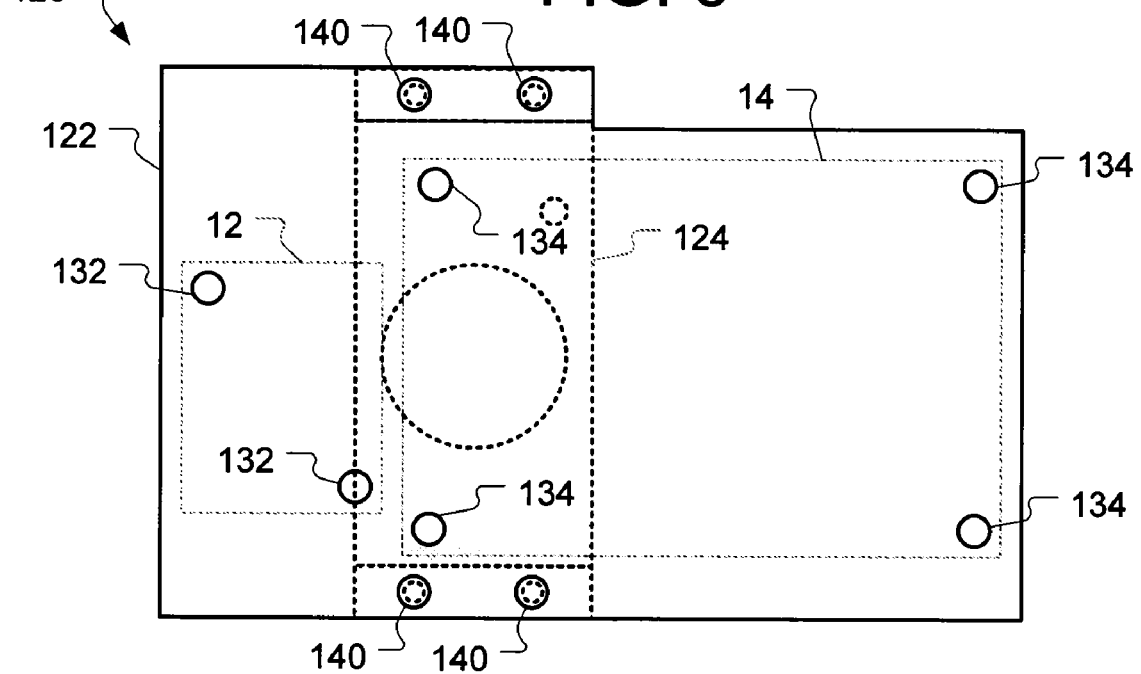
FIG. 5 illustrates the bracket of FIG. 4 with a portion illustrated in phantom.
Figure 6:
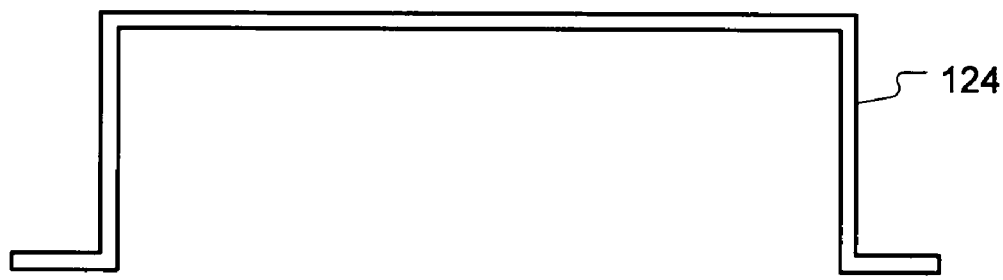
FIG. 6 illustrates a side view of a fan bracket of the bracket of FIG. 4.
Figure 7:
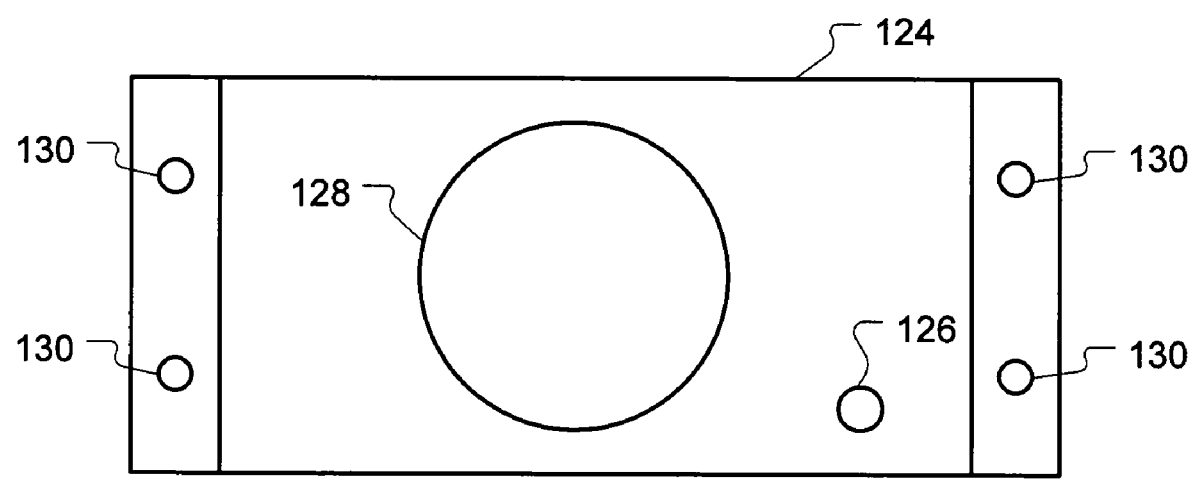
FIG. 7 illustrates a plan view of the fan bracket of FIG. 6.
Figure 8:
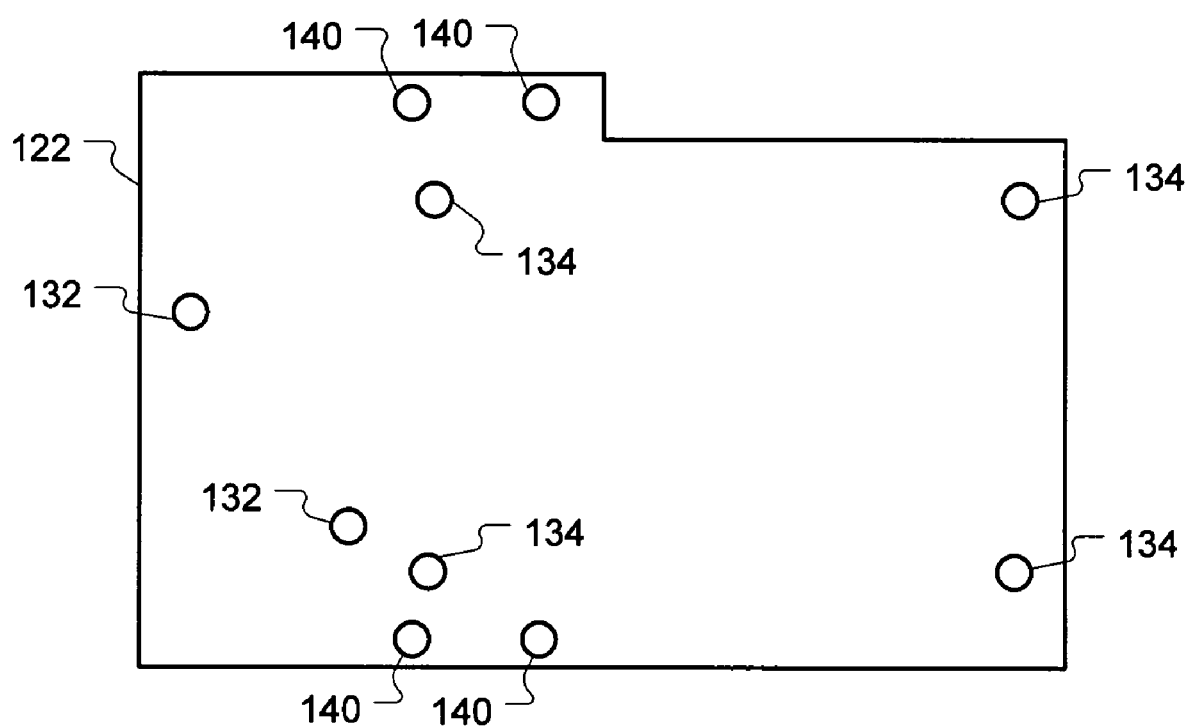
FIG. 8 illustrates plan view of a plate of the bracket of FIG. 4.

FIG. 4 illustrates a bracket for an electronic gaming machine interface system according to an embodiment. FIG. 5 illustrates the bracket of FIG. 4 with a portion illustrated in phantom. FIG. 6 illustrates a side view of a fan bracket of the bracket of FIG. 4. FIG. 7 illustrates a plan view of the fan bracket of FIG. 6. FIG. 8 illustrates plan view of a plate of the bracket of FIG. 4.

Referring to FIGS. 4-8, in an embodiment, the bracket 120 can include a first plate 122 and a second plate 124. The first plate 122 can include mounting sites 132 corresponding to the second circuit board 12. As used herein, a mounting site can be a variety of structures. For example, a mounting site can be a threaded hole configured to receive a screw, a threaded standoff, or the like. In another example, the mounting site can include a hole configured to receive a rivet, a brad, or any other fastener. In another example, the mounting site can include a stud configured to receive a nut. Any technique of fastening can be used with corresponding mounting sites.

Similar the mounting sites 132 for the second circuit board 12, the first plate 122 can include mounting sites 134 for the first circuit board 14. Thus, the first circuit board 14 can be coupled to the first plate 122. In addition, the first plate 122 can include mounting sites 140 for mounting the second plate 124. The second plate 124 can include corresponding mounting sites 130 for mounting to the mounting sites 140 of the first plate 122. Thus, the second plate 124 can be coupled to the first plate 122.

The second plate 124 can include an opening 128 configured to expose a fan. As illustrated the second plate 124 can include bends such that a portion of the second plate 124 is offset from the first plate 122. Accordingly, the second plate 124 can be coupled to the first plate 122 such that the second plate 124 is disposed over the first circuit board 14 and hence, the fan disposed in the opening 128 can be disposed over circuitry of the first circuit board 14.

In an embodiment, the bracket 120 can be configured to expose portions of the first circuit board 14. However, in another embodiment, the bracket 120 can substantially encapsulate the first circuit board 14. For example, the second plate 124 can be configured to extend along a length of the first plate 122 such that the second plate 124 is disposed over the entire first circuit board 14. In such an embodiment, the second circuit board 12 can still be substantially exposed; however, the first circuit board can be substantially isolated.

However, in another embodiment, the second circuit board 12 can also be substantially encapsulated by the bracket 120. For example, the second plate 124 can similarly extend over the second circuit board 12. The second plate 124 or other structure of the bracket 120 can be configured to expose the various switches 62 and 80 of the second circuit board 12. Thus, even though the first circuit board 14 and the second circuit board 12 are substantially encapsulated and hence, substantially isolated from other components, wiring, or the like within an electronic gaming machine, a user can still access the switches 62 and 80, or the like. Moreover, the bracket 120 can also include gaps, vents, or the like for exhaust or intake of air due to the fan, yet the first circuit board 14 and second circuit board 12 can still be substantially encapsulated.

In an embodiment, the second plate 124 can include an opening 126. The opening 126 can be configured to expose an interface of the first circuit board 14. For example, the first circuit board 14 can include a light emitting diode (LED) which can be configured to communicate a status of the first circuit board 14 to a user. Although the second plate 124, the bracket 120, or the like can substantially obscure such an LED, the opening 126 can expose the LED such that the first circuit board 14 can be substantially encapsulated while the interface of the LED is still available to the user. Although an LED has been used as an example, other interfaces of the first circuit board 14, the second circuit board 12, or the like can be similarly exposed through the bracket 120, the first plate 122, the second plate 124, or the like.

Although the term plate has been used to describe portions of a bracket, the plates can, but need not be substantially planar. For example, the plates can have angles, bends, or the like, such as those of the second plate 124 illustrated in FIGS. 6 and 7.

Although particular embodiments have been described, it will be appreciated that the principles of the invention are not limited to those embodiments. Variations and modifications may be made without departing from the principles of the invention as set forth in the following claims.

What is claimed is:

1. A system, comprising:
  a first circuit board, including:
    a first portion of a communication interface configured to be coupled to an electronic gaming machine;
    a second portion of the communication interface configured to be coupled to a player tracking unit;
    a first connector configured to receive power for the first circuit board; and
    a second connector coupled to a pad including at least three contacts;
  a bracket coupled to the first circuit board;
  a fan coupled to the bracket and disposed over the first circuit board;
  a second circuit board coupled to the bracket, and including:
    a third connector to be coupled to a power supply;
    a fourth connector;
    a first switch coupled between the third connector and the fourth connector and configured to selectively connect at least one conductor between the third connector and the fourth connector; and
    a fifth connector
    a second switch coupled to the fifth connector;
  a first cable coupled between the first connector of the first circuit board and the fourth connector of the second circuit board; and
  a second cable coupled between the second connector and the fifth connector;
  wherein the first circuit board is configured to be reset if two of the at least three contacts are shorted together.

2. The system of claim 1, wherein the fan includes a power cable coupled to the second circuit board.

3. The system of claim 1, wherein:
  the bracket comprises a first plate; and
  the first circuit board and the second circuit board are mounted to the first plate.

4. The system of claim 3, wherein:
  the bracket further comprises a second plate mounted to the first plate; and
  the fan is mounted to the second plate.

5. The system of claim 1, wherein the bracket is configured to substantially encapsulate the first circuit board and the second circuit board.

6. The system of claim 1, wherein the at least three contacts of the first circuit board are disposed in at least two rows.

7. The system of claim 6, wherein:
  the at least three contacts of the first circuit board includes 40 contacts disposed in two rows; and
  the second connector of the first circuit board is a 40 pin connector.

8. A system, comprising:
  a first circuit board, including:
    a communication interface configured to be coupled to an electronic gaming machine; and
    a first connector configured to receive power for the first circuit board;
  a bracket coupled to the first circuit board;
  a second circuit board coupled to the bracket, and including:
    a second connector to be coupled to a power supply;
    a third connector;
    a switch coupled between the second connector and the third connector and configured to selectively connect at least one conductor between the second connector and the third connector; and
  a cable coupled between the first connector of the first circuit board and the third connector of the second circuit board.

9. The system of claim 8, wherein:
  the bracket is configured to substantially encapsulate the second circuit board; and
  the switch of the second circuit board is exposed through the bracket.

10. The system of claim 8, further comprising:
  a fan coupled to the bracket;
  wherein a power supply for the fan is coupled to the second circuit board such that power can be selectively provided to the fan in response to the switch of the second circuit board.

11. A system, comprising:
  a first circuit board, including:
    a communication interface configured to be coupled to an electronic gaming machine;
    a first connector coupled to a pad including at least three contacts;
  a bracket coupled to the first circuit board;
  a second circuit board, including:
    a second connector
    a switch coupled to the second connector and configured to short at least two contacts of the second connector together;
  a cable coupled between the first connector and the second connector;
  wherein the first circuit board is configured to be reset if two of the at least three contacts are shorted together.

12. The system of claim 11, wherein the at least three contacts of the first connector are disposed in at least two rows.

13. The system of claim 12, wherein:
  the at least three contacts of the first circuit board includes 40 contacts disposed in two rows; and
  the first connector of the first circuit board is a 40 pin connector.

* * * * *